US008792654B2

(12) United States Patent
Basaran et al.

(10) Patent No.: US 8,792,654 B2
(45) Date of Patent: Jul. 29, 2014

(54) AUDIO EQUIPMENT AND A SIGNAL PROCESSING METHOD THEREOF

(75) Inventors: Fahrettin Basaran, Istanbul (TR); Ahmet Hasan Serafettinoglu, Istanbul (TR); Recep Cagri Yuzbasioglu, Istanbul (TR)

(73) Assignee: Arcelik Anonim Sirketi, Istanbul (TR)

( * ) Notice: Subject to any disclaimer, the term of this patent is extended or adjusted under 35 U.S.C. 154(b) by 327 days.

(21) Appl. No.: 13/143,014

(22) PCT Filed: Dec. 16, 2009

(86) PCT No.: PCT/EP2009/067302
§ 371 (c)(1), (2), (4) Date: Sep. 27, 2011

(87) PCT Pub. No.: WO2010/076222
PCT Pub. Date: Jul. 8, 2010

(65) Prior Publication Data

US 2012/0002824 A1 Jan. 5, 2012

(30) Foreign Application Priority Data

Dec. 30, 2008 (TR) .............................. A 2008/10018

(51) Int. Cl.
*H03G 5/00* (2006.01)

(52) U.S. Cl.
USPC .............................. 381/98; 704/205; 704/231

(58) Field of Classification Search
USPC .................................... 381/98; 704/231, 205
See application file for complete search history.

(56) References Cited

U.S. PATENT DOCUMENTS 5,912,829 A * 6/1999 Maier .......................... 708/404
7,342,168 B2 * 3/2008 Setoguchi ...................... 84/619

* cited by examiner

*Primary Examiner* — Davetta W Goins
*Assistant Examiner* — Oyesola C Ojo
(74) *Attorney, Agent, or Firm* — Venable, Campillo, Logan & Meaney PC

(57) ABSTRACT

The present invention relates to an audio equipment (1) and a signal processing method thereof, wherein the mismatches that can occur at the packet boundaries in an audio signal, which is processed in packets by utilizing the missing fundamental phenomenon and which is formed again by the concatenating of these packets, are eliminated.

5 Claims, 3 Drawing Sheets

AUDIO EQUIPMENT AND A SIGNAL PROCESSING METHOD THEREOF

TECHNICAL FIELD

Figure 1:
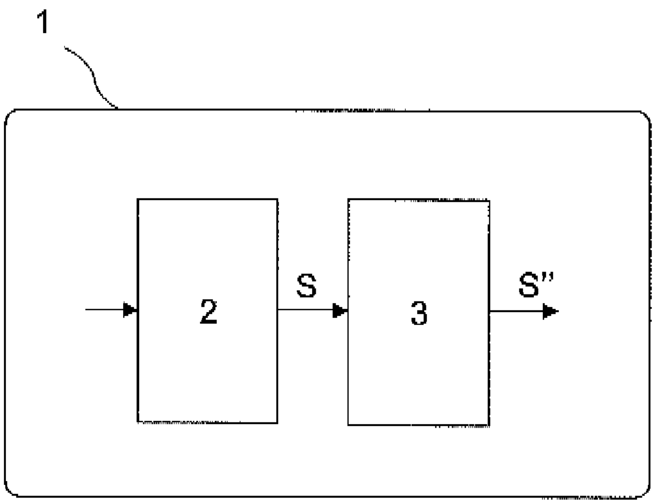

The present invention relates to an audio equipment which utilizes the missing fundamental phenomenon while processing the audio signal.

THE PRIOR ART

Audio equipments convert electrical audio signals having content such as music and speech into audible sound. These equipments comprise electroacoustic transducers, such as loudspeakers, realizing the said conversion. Electroacoustic transducers operate in certain frequency range and cannot convert the audio signals outside this frequency range into sound. This situation adversely affects the sound quality when bass sounds particularly with low frequencies are required to be generated. Because, transducers have a certain low cut-off frequency and cannot convert the audio signals below this frequency into sound. One of the solutions used to overcome this problem is to utilize the missing fundamental phenomenon causing a psycho-acoustic effect. The fundamental frequency is the lowest frequency generated by an instrument. Beside the fundamental frequency, harmonics of this fundamental frequency are also generated. According to the missing fundamental phenomenon, even if the fundamental frequency of the audio signal is not present in the generated sound, audience hears the harmonics of the fundamental frequency and thus, supposedly hears the same fundamental frequency. More than one fundamental frequency is present in an audio signal, in the content of which more than one simultaneously played instrument is present. The missing fundamental phenomenon is also valid for audio signals, in the content of which more than one fundamental frequency is present. In other words, even if the related fundamental frequencies are not present in the generated sound, audience hears the harmonics of these fundamental frequencies and perceives the same fundamental frequencies.

While generating missing fundamental effect, the fundamental frequency or frequencies, which are present in the audio signal and which are lower than the cut-off frequency of the electroacoustic transducer, are suppressed, and the amplitudes of the harmonics of the fundamental frequency or frequencies are increased and the processed audio signal is applied to the electroacoustic transducer. Thus, the electroacoustic transducer, which will not be able to generate the fundamental frequency or frequencies that are lower than the cut-off frequency, generates the harmonics of the fundamental frequency or frequencies and thus, creates the effect of listening to the same fundamental frequency or frequencies on the audience in a psycho-acoustic manner. The method that is widely used in the solutions utilizing the said phenomenon is to separate the digital audio signal into packets by various methods and to process each packet separately. The audio signal processed in packets is then brought to final state by the packets being concatenated again. However, while the processed packets are concatenated again in an electroacoustic manner, some mismatches can occur between the sequential packets. This mismatch is sometimes at an audible level and disturbs the audience.

In the state of the art U.S. Pat. No. 6,370,502, a method for eliminating the discontinuity between the processed audio signal packets is described. In this invention, elimination of quantization-induced block-discontinuities by means of the wavelet transform technique by using a buffer is described.

BRIEF DESCRIPTION OF THE PRESENT INVENTION

The aim of the present invention is the realization of an audio equipment, the bass performance of which is improved.

According to the audio equipment and the signal processing method realized in order to attain the aim of the present invention, explicated in the first claim and the respective claims thereof, analog audio signal is converted into digital audio signal by means of an analog/digital converter and processed by means of a processor. As a result of these processes, an audio signal, which has missing fundamental effect and the mismatch between the packets of which is eliminated, is provided.

The digital audio signal is first separated into n packets in the processor. Then, Fast Fourier Transform (FFT) is applied to these packets. The fundamental frequency or frequencies of each packet are determined in sequence. In order to create the missing fundamental effect, new amplitude values of the harmonics of the fundamental frequency or frequencies are determined after these fundamental frequency or frequencies are suppressed. New amplitude values of the harmonics are determined by associating the amplitude of the related harmonic in the previous packet and the amplitude thereof in the packet being processed, by using a weight coefficient specific for the frequency of the related harmonic. Thus, mismatches between packets, which can occur at the packet boundaries depending on the increasing of the harmonic amplitudes of the fundamental frequency or frequencies while creating missing fundamental effect, are eliminated.

DETAILED DESCRIPTION OF THE PRESENT INVENTION

The audio equipment realized in order to attain the aim of the present invention is illustrated in the attached figures, where:

FIG. 1—is the schematic view of the audio equipment of the present invention.

Figure 2:
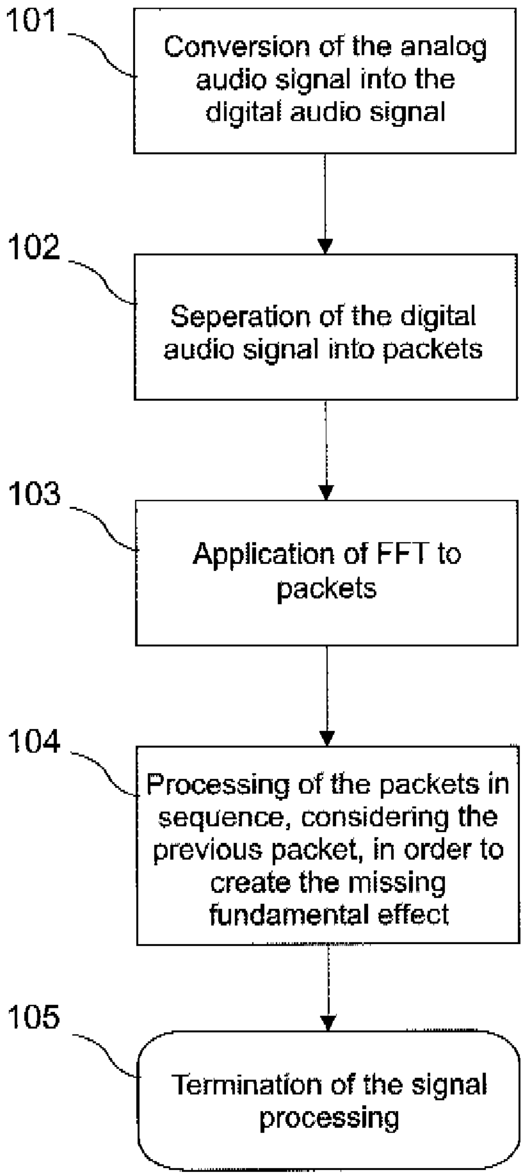

FIG. 2—is the data flow diagram of the signal processing method of the present invention.

Figure 3:
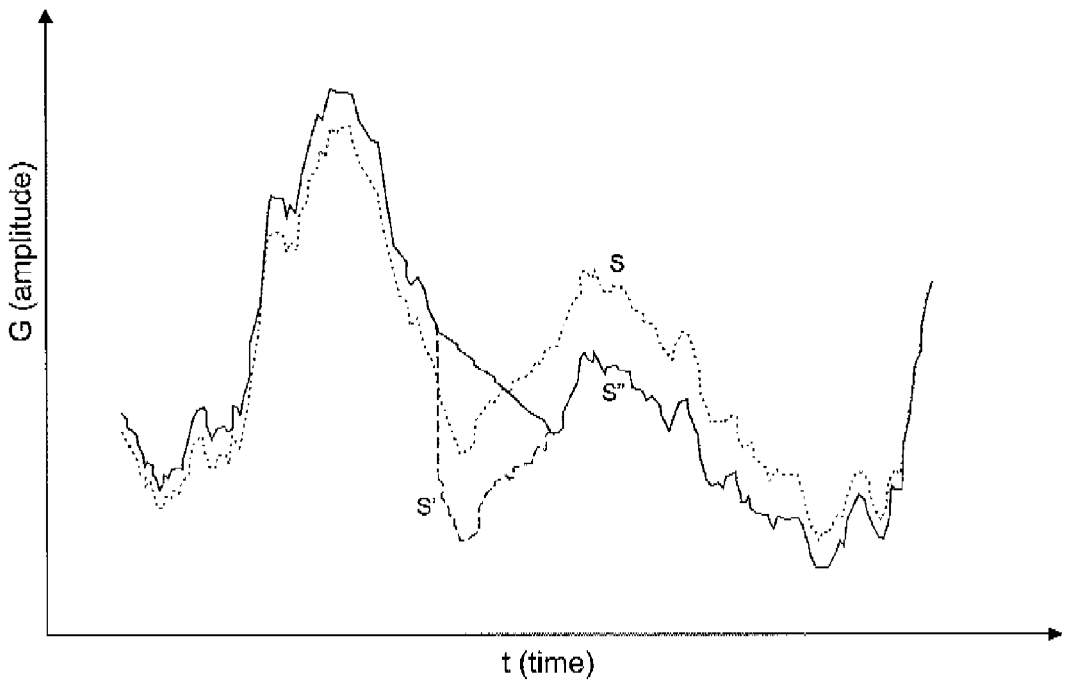

FIG. 3—is the amplitude-time graph illustrating the original audio signal, the audio signal wherein missing fundamental effect is created according to the prior art, and the audio signal wherein missing fundamental effect is created according to the present invention.

The elements illustrated in the figures are numbered as follows:

1. Audio equipment
2. Analog/digital converter
3. Processor

The audio equipment (1) comprises an analog/digital converter (2) which converts the analog audio signal into digital audio signal (S) and at least one processor (3) which separates the digital audio signal (S) into packets, applies Fast Fourier Transform (FFT) to these packets, detects the fundamental frequency or frequencies of each packet in sequence; and, after suppressing these fundamental frequency or frequencies to create missing fundamental effect, determines the new amplitude values of the harmonics of these fundamental frequency or frequencies by associating the amplitude of the related harmonic in the previous packet and the amplitude thereof in the packet being processed, with a weight coefficient specific for the frequency of the related harmonic (FIG. 1).

The audio processing method used for creating the missing fundamental effect in the audio equipment (1) comprises the following steps:

Conversion of the analog audio signal into digital audio signal (S) (101),

Separation of the digital audio signal (S) into packets (102),

Application of FFT to packets (103),

Processing of the packets in sequence, considering the previous packet, in order to create the missing fundamental effect (104), Termination of the signal processing (105)

(FIG. 2).

In the audio equipment (1), the analog audio signal is converted into digital audio signal (S) by means of an analog/digital converter (2) (101). In the processing of the digital audio signal (S), the processes thereafter are realized by means of the processor (3). The digital audio signal (S) is first separated into 'n' packets (102). Afterwards, FFT is applied to all packets and the packets are transformed from the time domain to the frequency domain (103).

After FFT is applied to the packets, the packets in the frequency domain are processed in sequence for creating the missing fundamental effect (104). In this step, the fundamental frequency or frequencies, which cannot be converted into audible sound (for example low frequencies belonging to bass sounds), are detected in each packet and these fundamental frequency or frequencies are removed from the signal content. However, in order to create an effect as if this content is present in the sound provided to the user, the amplitudes of the harmonics of the removed fundamental frequency or frequencies are increased by means of the processor (2) and the missing fundamental effect is created. In this step (104), in order to eliminate the mismatches that can occur at the packet boundaries depending on changing the amplitudes of the harmonics, the packets are processed not as being independent of each other, but by considering the association of the packet with the previous packet. For this purpose, the following formula is used for determining the amplitudes of the harmonics belonging to the fundamental frequency or frequencies that are suppressed to create the missing fundamental effect (104):

$$F'_n(i)=(F_{n-1}(i)*(1-K(i)))+(F_n(i)*K(i))$$

"n" in the formula expresses the sequence number of the packet being processed. "i" expresses the harmonic, the amplitude of which will be determined in the packet being processed. "$F_n(i)$" expresses the FFT value of the harmonic (i), the amplitude of which will be determined, of the packet being processed (n). "$F_{n-1}(i)$" expresses the FFT value of the harmonic (i), the amplitude of which will be determined in the packet being processed (n), in the packet (n−1) previous to the packet being processed. "$F'_n(i)$" expresses the new FFT value of the harmonic (i), the amplitude of which will be determined, of the packet being processed (n). FFT value corresponds to energy in the frequency domain and to amplitude in the time domain. "K(i)" expresses a weight coefficient that has a value between 0 and 1 and that is determined according to the frequency value of the harmonic (i), the amplitude of which will be determined.

The weight coefficient K(i) is predetermined by the manufacturer for various frequency values or ranges. This coefficient is the coefficient that determines to what extent the previous packet will be taken into consideration during the processing of a packet. As the value K(i) approaches 0, the new value of the i'th harmonic of the packet being processed approaches the value of the related harmonic in the previous packet. Similarly, as the value K(i) approaches 1, the new value of the i'th harmonic of the packet being processed approaches the value of the related harmonic in the packet being processed. After each packet is processed in sequence and the missing fundamental effect is created, the signal processing operation is terminated (105).

The processed audio signal (S") provided by concatenating the processed packets becomes ready for being transmitted to a unit or device that will convert the signal (S") into audible sound.

While the missing fundamental effect is created (104), the mismatches that can occur at the packet boundaries are prevented by means of the processing of the sequential packets by being evaluated together. Thus, in the audio signal (S") that is formed by the packets being concatenated again, sudden amplitude changes (S') at packet concatenating areas and relative undesired noises in the sound provided to the user are prevented (FIG. 3). According to the audio equipment (1) and signal processing method of the present invention; after being processed in the processor (2), the unprocessed audio signal (S) at the processor (2) input becomes a signal (S') which has missing fundamental effect and wherein the mismatches that can occur during the concatenating of the packets are eliminated.

The invention claimed is:

1. An audio equipment comprising an analog/digital converter which converts an analog audio signal into a digital audio signal; and at least one processor (3) being operable to separate the digital audio signal into packets, to apply a Fast Fourier Transform (FFT) to these packets, to detect the fundamental frequency or the fundamental frequencies of each packet in sequence; and, wherein the at least one processor being operable after suppressing the fundamental frequency or fundamental frequencies to create missing fundamental effect, which determine the new amplitude values of the harmonics of the fundamental frequency or fundamental frequencies by associating the amplitude of the related harmonic in the previous packet and the amplitude thereof in the packet being processed, with a weight coefficient specific for the frequency of the related harmonic, wherein the weight coefficient varies between 0 and 1.

2. An audio equipment (1) comprising an analog/digital converter (2) which converts the analog audio signal into digital audio signal (S); characterized by at least one processor (3)

which separates the digital audio signal (S) into packets, which applies Fast Fourier Transform (FFT) to these packets, which detects the fundamental frequency or frequencies of each packet in sequence;

and, after suppressing these fundamental frequency or frequencies to create missing fundamental effect, which determines the new amplitude values of the harmonics of these fundamental frequency or frequencies by associating the amplitude of the related harmonic in the previous packet and the amplitude thereof in the packet being processed, with a weight coefficient specific for the frequency of the related harmonic and wherein the at least one processor (3) that determines the new FFT value ($F'_n(i)$) of the harmonic (i) which belongs to the fundamental frequency or one of the frequencies in the packet being processed (n), and the new amplitude of which will be determined, by using the present FFT value ($F_n$(i)) of the harmonic (i), the new amplitude of which will be determined in the packet being processed (n), the FFT value ($F_{n-1}$(J)) of the harmonic (i), the amplitude of which will be determined in the packet being processed (n), in the packet (n−1) previous to the packet being processed a weight coefficient (K(i)) which is predetermined by a manufacturer for various frequency values or frequency ranges, and which varies between 0 and 1, according to the following formula: $F'_n(i)=(F_{n-1}(i)*(1-K(i)))+(F_n(i)*K(i))$.

3. A signal processing method for an audio equipment (1) comprising an analog/digital converter (2) which converts the analog audio signal into digital audio signal (S); characterized by at least one processor (3)

which separates the digital audio signal (S) into packets, which applies Fast Fourier Transform (FFT) to these packets, which detects the fundamental frequency or frequencies of each packet in sequence;

and, after suppressing these fundamental frequency or frequencies to create missing fundamental effect, which determines the new amplitude values of the harmonics of these fundamental frequency or frequencies by associating the amplitude of the related harmonic in the previous packet and the amplitude thereof in the packet being processed, with a weight coefficient specific for the frequency of the related harmonic and wherein the at least one processor (3) that determines the new FFT value ($F'_n$(i) of the harmonic (i) which belongs to the fundamental frequency or one of the frequencies in the packet being processed (n), and the new amplitude of which will be determined, by using the present FFT value ($F_n$(i)) of the harmonic (i), the new amplitude of which will be determined in the packet being processed (n), the FFT value $F_{n-1}$(J)) of the harmonic (i), the amplitude of which will be determined in the packet being processed (n), in the packet (n−1) previous to the packet being processed a weight coefficient (K(i)) which is predetermined by a manufacturer for various frequency values or frequency ranges, and which varies between 0 and 1, according to the following formula: $F'_n(i)=F_{n-1}(i)*(1-K(i)))+F_n(i)*K(i)$, the signal processing method comprising the steps of:

Conversion of the analog audio signal into digital audio signal (S) (101),

Separation of the audio signal (S) into packets (102),

Application of FFT to packets (103),

Processing of the packets in sequence, considering the previous packet, in order to create the missing fundamental effect (104), —Termination of the signal processing (105).

4. The audio equipment (1) as in claim 1, wherein the at least one processor (3) being operable to determine the new FFT value ($F'_n$(i)) of the harmonic (i) which belongs to the fundamental frequency or one of the fundamental frequencies in the packet being processed (n), and the new amplitude of which will be determined, by using the present FFT value ($F_n$(i)) of the harmonic (i), the new amplitude of which will be determined in the packet being processed (n), the FFT value ($F_{n-1}$(J)) of the harmonic (i), the amplitude of which will be determined in the packet being processed (n), in the packet (n−1) previous to the packet being processed a weight coefficient (K(i)) which is predetermined by a manufacturer for various frequency values or frequency ranges, and which varies between 0 and 1, according to the following formula: $F'_n(i)=(F_{n-1}(i)*(1-K(i)))+(F_n(i)*K(i))$.

5. The signal processing method for an audio equipment (1) as in claim 4, comprising the steps of:

converting the analog audio signal into the digital audio signal (S) (101), separating of the digital audio signal (S) into packets (102), applying Fast Fourier Transform (FFT) to these packets (103), detecting the fundamental frequency of the fundamental frequencies of each packet in sequence wherein after suppressing the fundamental or the fundamental frequencies to create missing fundamental effect, Determining the new amplitude values of the harmonics of the fundamental or the fundamental frequencies by associating the amplitude of the related harmonic in the previous packet and the amplitude thereof in the packet being processed, with a weight coefficient specific for the frequency of the related harmonic (104), and terminating the signal processing (105).

* * * * *